(12) United States Patent
Loeffler et al.

(10) Patent No.: US 10,811,582 B2
(45) Date of Patent: Oct. 20, 2020

(54) ARRANGEMENT

(71) Applicant: OSRAM OLED GmbH, Regensburg (DE)

(72) Inventors: Andreas Loeffler, Neutraubling (DE); Thomas Hager, Massing (DE); Christoph Walter, Regensburg (DE); Alfred Lell, Maxhuette-Haidhof (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/737,738

(22) PCT Filed: Jun. 15, 2016

(86) PCT No.: PCT/EP2016/063760
§ 371 (c)(1),
(2) Date: Dec. 18, 2017

(87) PCT Pub. No.: WO2016/202860
PCT Pub. Date: Dec. 22, 2016

(65) Prior Publication Data
US 2018/0182946 A1    Jun. 28, 2018

(30) Foreign Application Priority Data
Jun. 18, 2015 (DE) .......... 10 2015 109 788

(51) Int. Cl.
*H01L 33/64* (2010.01)
*H01L 25/16* (2006.01)
(Continued)

(52) U.S. Cl.
CPC .......... *H01L 33/641* (2013.01); *H01L 25/165* (2013.01); *H01L 25/167* (2013.01);
(Continued)

(58) Field of Classification Search
CPC ... H01L 33/641; H01L 33/642; H01L 33/483; H01L 33/00; H01L 33/48; H01L 33/62; H01L 33/64; H01L 33/58; H01L 33/647; H01L 33/50; H01L 33/54; H01L 33/52; H01L 33/60; H01L 33/505; H01L 25/16;
(Continued)

(56) References Cited

U.S. PATENT DOCUMENTS 5,825,054 A    10/1998    Lee et al.
7,300,182 B2   11/2007    Mazzochette
(Continued)

FOREIGN PATENT DOCUMENTS

CN    2255682 Y    6/1997
CN    1848563 A    10/2006
(Continued)

*Primary Examiner* — Chuong A Luu
(74) *Attorney, Agent, or Firm* — Slater Matsil, LLP

(57) ABSTRACT

An arrangement is disclosed. In an embodiment the arrangement includes at least one semiconductor component and a heat sink, wherein the semiconductor component is arranged on the heat sink, wherein the heat sink is configured to dissipate heat from the semiconductor component, wherein the heat sink comprises a thermally conductive material, and wherein the material comprises at least aluminum and silicon.

13 Claims, 11 Drawing Sheets

(51) Int. Cl.
*H01L 31/02* (2006.01)
*H01L 31/024* (2014.01)
*H01L 31/167* (2006.01)
*H01L 33/48* (2010.01)
*H01L 33/62* (2010.01)
*H01S 5/022* (2006.01)
*H01S 5/024* (2006.01)
*H01L 31/0232* (2014.01)
*H01L 33/58* (2010.01)
*H01S 5/00* (2006.01)

(52) U.S. Cl.
CPC ...... *H01L 31/024* (2013.01); *H01L 31/02005* (2013.01); *H01L 31/167* (2013.01); *H01L 33/483* (2013.01); *H01L 33/62* (2013.01); *H01L 33/642* (2013.01); *H01L 33/647* (2013.01); *H01S 5/02248* (2013.01); *H01S 5/02272* (2013.01); *H01S 5/02469* (2013.01); *H01S 5/02476* (2013.01); *H01L 31/02327* (2013.01); *H01L 33/58* (2013.01); *H01L 2224/48247* (2013.01); *H01L 2224/48465* (2013.01); *H01L 2224/73265* (2013.01); *H01S 5/0071* (2013.01)

(58) Field of Classification Search
CPC ... H01L 25/165; H01L 25/167; H01L 25/075; H01L 25/0753; H01L 31/02; H01L 31/024; H01L 31/02005; H01L 31/02327; H01L 2224/48465; H01L 2224/73256; H01L 2224/73265; H01L 2224/48247; H01L 2924/00; H01L 2924/12041; H01L 2924/0002; H01S 5/024; H01S 5/022; H01S 5/0071; H01S 5/02469; H01S 5/02476; H01S 5/02272; H01S 5/02248
USPC .......................................................... 257/82
See application file for complete search history.

(56) References Cited

U.S. PATENT DOCUMENTS

| | | | |
|---|---|---|---|
| 8,546,842 B2 | 10/2013 | Higuma et al. | |
| 9,070,853 B2 | 6/2015 | Moellmer et al. | |
| 9,404,028 B2 | 8/2016 | Lin et al. | |
| 2003/0155661 A1* | 8/2003 | Auburger | H01L 23/3677 257/778 |
| 2006/0091415 A1* | 5/2006 | Yan | H01L 33/60 257/99 |
| 2008/0019133 A1 | 1/2008 | Kim et al. | |
| 2008/0265266 A1* | 10/2008 | Bogner | H01L 33/60 257/98 |
| 2010/0295070 A1 | 11/2010 | Su et al. | |
| 2011/0280266 A1 | 11/2011 | Hayashi et al. | |
| 2012/0112236 A1* | 5/2012 | Higuma | H01L 33/641 257/98 |
| 2014/0001944 A1 | 1/2014 | Kim et al. | |
| 2015/0103856 A1 | 4/2015 | Hagino et al. | |
| 2015/0108531 A1 | 4/2015 | Schwarz et al. | |
| 2015/0115304 A1* | 4/2015 | Singer | F21V 9/30 257/98 |
| 2016/0141830 A1 | 5/2016 | Kim | |

FOREIGN PATENT DOCUMENTS

| | | |
|---|---|---|
| CN | 102244364 A | 11/2011 |
| CN | 101852902 B | 4/2012 |
| CN | 103119807 A | 5/2013 |
| CN | 103811651 A | 5/2014 |
| CN | 102473829 B | 12/2014 |
| CN | 104364982 A | 2/2015 |
| DE | 112005003345 T5 | 11/2007 |
| DE | 102012207519 A1 | 11/2013 |
| EP | 2455991 A1 | 5/2012 |
| WO | 2010140541 A1 | 12/2010 |
| WO | 2014204094 A1 | 12/2014 |

* cited by examiner

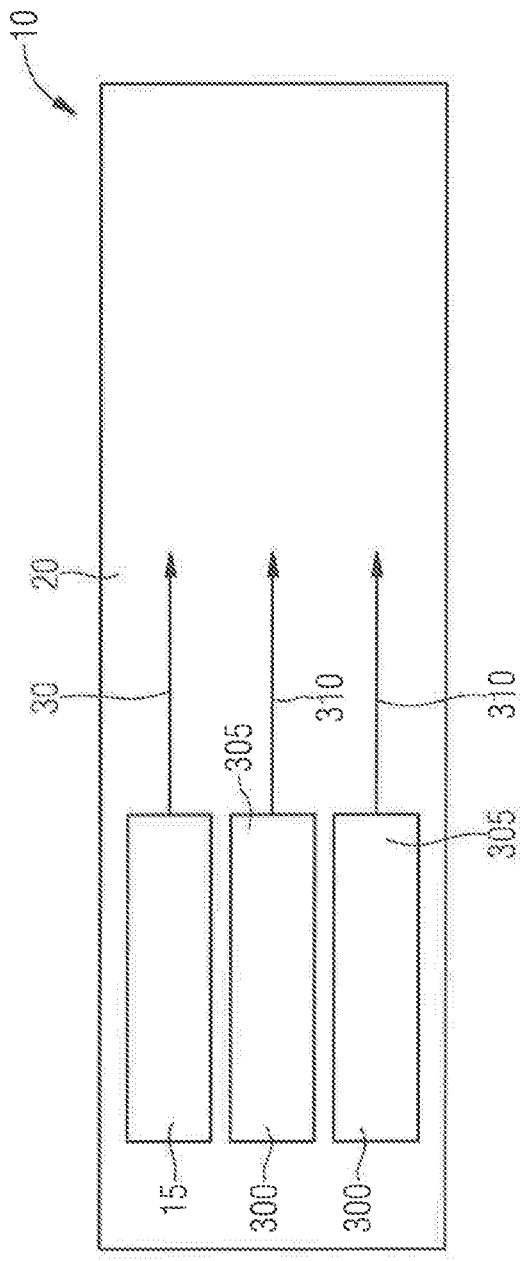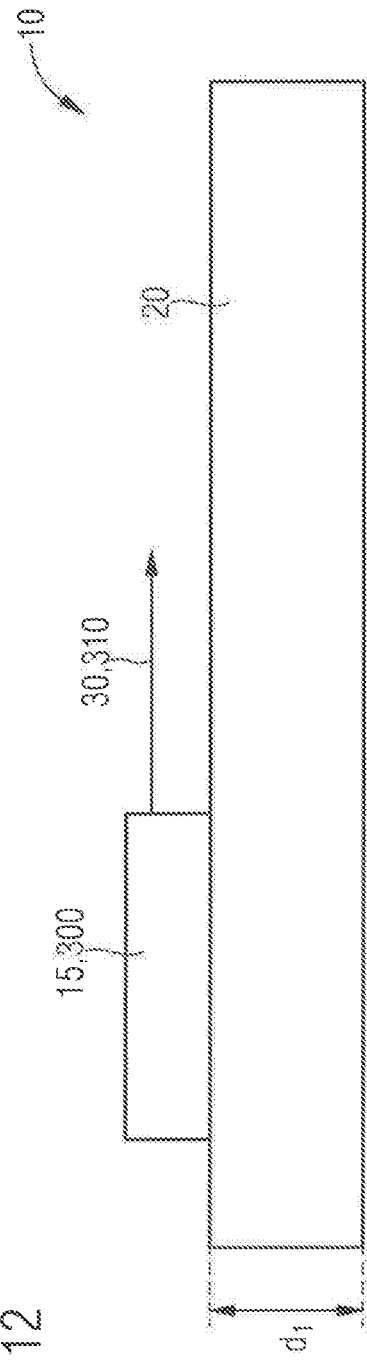

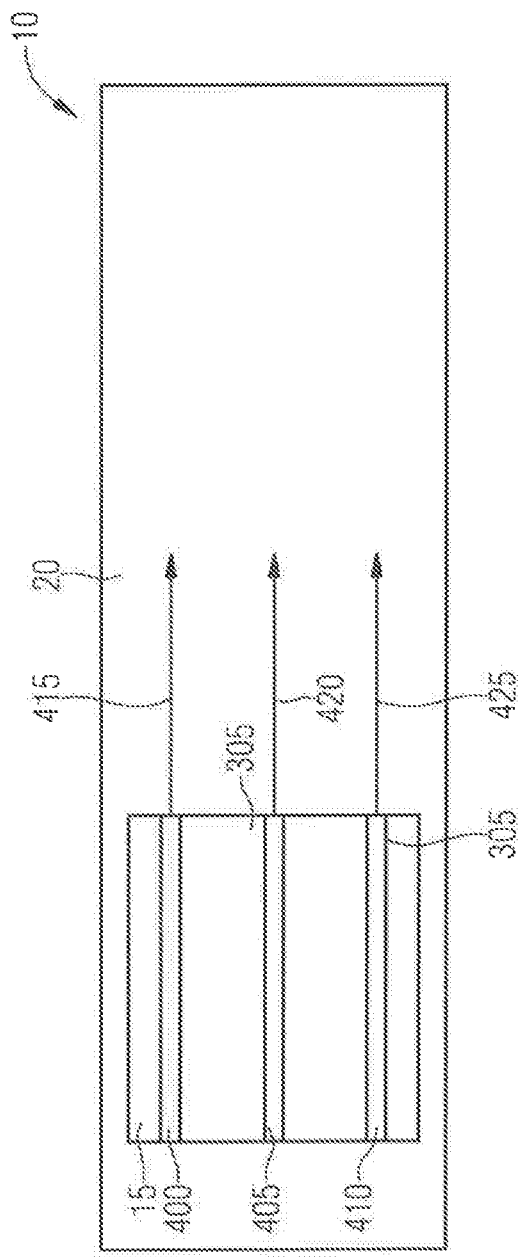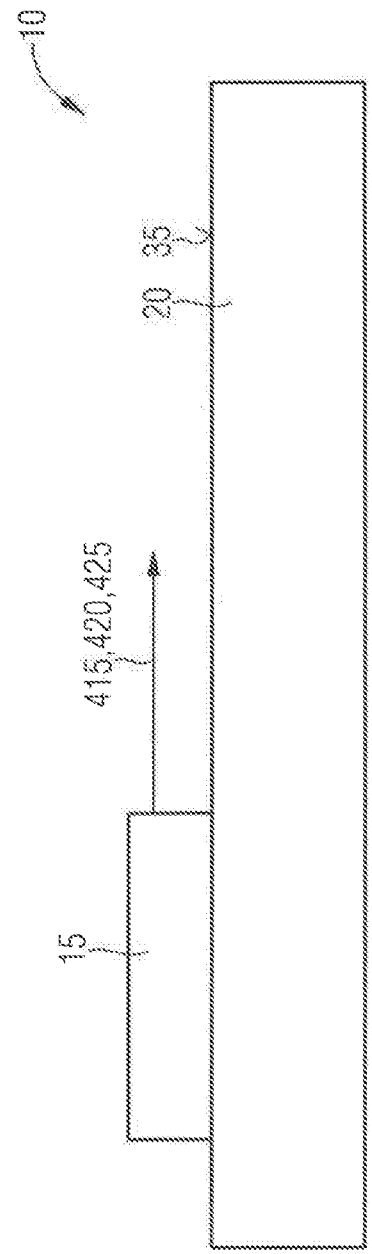

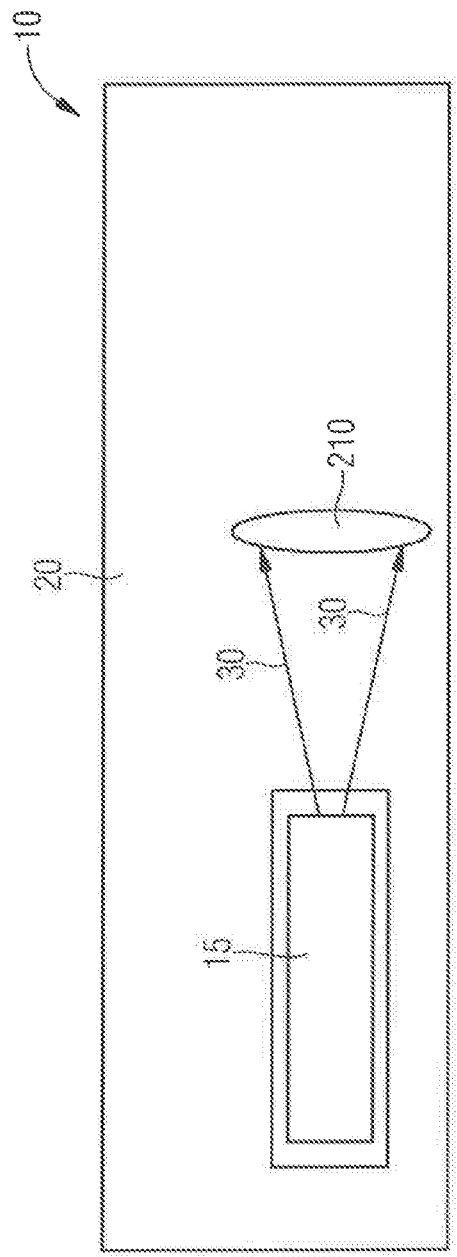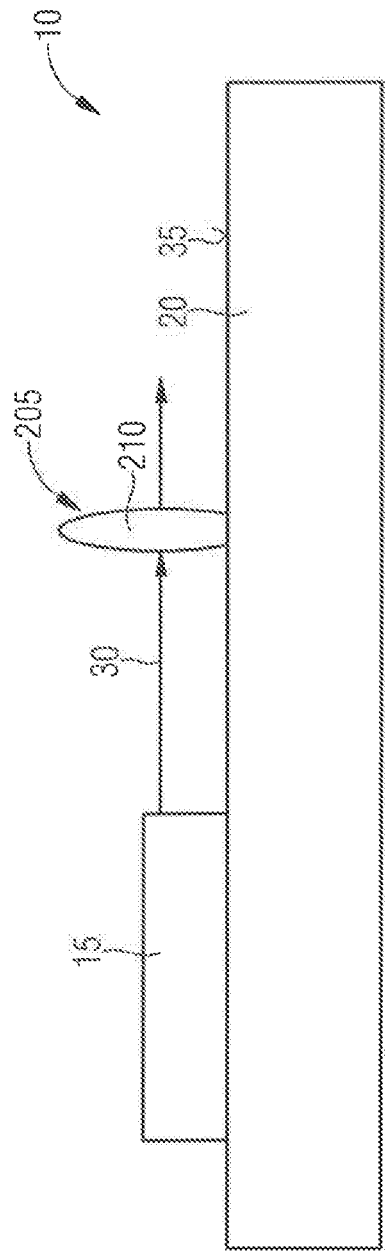

ARRANGEMENT

This patent application is a national phase filing under section 371 of PCT/EP2016/063760, filed Jun. 15, 2016, which claims the priority of German patent application 10 2015 109 788.5, filed Jun. 18, 2015, each of which is incorporated herein by reference in its entirety.

TECHNICAL FIELD

The invention relates to an arrangement with a semiconductor component and a heat sink.

BACKGROUND

Arrangements comprising a laser chip and a heat sink are known, wherein the laser diode is arranged on the heat sink and the heat sink is configured to dissipate heat from the laser chip.

SUMMARY OF THE INVENTION

Embodiments provide an improved arrangement.

It has been recognized that an improved arrangement may be provided by virtue of the fact that the arrangement comprises at least one semiconductor component and a heat sink, wherein the semiconductor component is arranged on the heat sink, wherein the heat sink is configured to dissipate heat from the semiconductor component. The heat sink comprises a material, wherein the material of the heat sink is thermally conductive. The material of the heat sink comprises aluminum and silicon.

This configuration of the heat sink has the advantage that the heat sink is producible particularly cost-effectively. Furthermore, the heat sink comprising said material comprises a lower temperature dependence in a thermal conductivity. This is advantageous particularly at relatively high temperatures of the heat sink, since then the heat sink comprises a particularly high thermal conductivity.

It is particularly advantageous if the heat sink is configured to be electrically and thermally conductive.

In a further embodiment, the material of the heat sink comprises a proportion by mass of aluminum which is less than 40 percent, in particular less than 25 percent, and at least greater than 10 percent, in particular greater than 15 percent.

In a further embodiment, the material of the heat sink comprises a proportion by mass of silicon which is greater than 60 percent, in particular greater than 75 percent, and at least less than 95 percent, preferably less than 90 percent, in particular less than 85 percent.

In a further embodiment, the heat sink comprises a thickness comprising a value, wherein the value of the thickness is in a range of 50 μm to 300 μm, in particular in a range of 80 μm to 120 μm. However, the heat sink may also comprise a thickness of 100 μm.

In a further embodiment, a thermal conductivity of the heat sink in particular in a temperature range of 20° C. to 130° C. comprises a value which is in a range of 180 W/mK to 350 W/mK, in particular of 190 W/mK to 300 W/mK.

In a further embodiment, the semiconductor component comprises a first contact and a second contact. An electrical insulation layer is arranged between the semiconductor component and the heat sink. The electrical insulation layer comprises at least one recess. In this case, an electrical connection is arranged in the recess, which electrically connects the second contact to the heat sink. In this way, a number of electrical connections in the arrangement may be reduced, such that the arrangement is producible particularly simply and cost-effectively. Furthermore, a complexity of the arrangement is reduced.

In a further embodiment, a connection layer is arranged between the electrical insulation layer and the semiconductor component, wherein the connection layer mechanically connects the semiconductor component to the electrical insulation layer.

In a further embodiment, the arrangement comprises a first contact conductor, at least one second contact conductor and a housing comprising a housing wall. The first contact conductor and the second contact conductor are arranged at a distance from one another. The first contact conductor and the second contact conductor are led through the housing wall and are electrically insulated from one another by the housing wall. The heat sink is arranged at least partly between the first contact conductor and the second contact conductor. The heat sink is electrically connected to the first contact conductor.

In a further embodiment, the semiconductor component is configured as an optoelectronic semiconductor component. Advantageously, the optoelectronic semiconductor component comprises at least one laser chip or an LED chip. The laser chip or the LED chip is configured to provide electromagnetic radiation comprising a beam direction.

In a further embodiment, the arrangement comprises a photodiode comprising a first photodiode contact and a second photodiode contact and also a third contact conductor, which is led through the housing wall. The first photodiode contact is electrically connected to the first contact of the semiconductor component and the second photodiode contact is electrically connected to the third contact conductor.

In a further embodiment, a heat spreader is provided. The heat spreader preferably comprises a larger extent than the semiconductor component at least in one direction of extent of the semiconductor component. The heat spreader is arranged between the semiconductor component and the heat sink and is configured to pass on the heat from the semiconductor component to the heat sink.

In a further embodiment, the heat spreader comprises at least one of the following materials: silicon carbide (SiC), aluminum nitrite (AlN), copper (Cu), diamond, boron nitrite, copper-tungsten (CuW).

In a further embodiment, the arrangement comprises an optical device. The optical device is arranged on the heat sink and is mechanically and thermally coupled to the heat sink. The optical device is configured to alter at least partly a beam direction of a light beam.

In a further embodiment, the arrangement comprises at least one further optoelectronic semiconductor component, wherein the further optoelectronic semiconductor component comprises at least one further laser chip or a further LED chip, wherein the further laser chip or the further LED chip is configured to provide a further electromagnetic radiation, wherein the semiconductor component and the further optoelectronic semiconductor component are arranged jointly on the heat sink.

In a further embodiment, the further optoelectronic semiconductor component is arranged in a manner laterally offset with respect to the beam direction of the semiconductor component. Alternatively, the further optoelectronic semiconductor component is arranged opposite the semiconductor component in the beam direction of the semiconductor component.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings, wherein

FIG. 11 shows a plan view of an arrangement in accordance with a fourth embodiment;

FIG. 12 shows a side view of the arrangement shown in FIG. 11;

FIG. 13 shows a plan view of an arrangement in accordance with a fifth embodiment;

FIG. 14 shows a schematic illustration of a side view of the arrangement shown in FIG. 13;

FIG. 15 shows a plan view of an arrangement in accordance with a sixth embodiment;

FIG. 16 shows a side view of the arrangement shown in FIG. 15;

DETAILED DESCRIPTION OF ILLUSTRATIVE EMBODIMENTS

Figure 1:
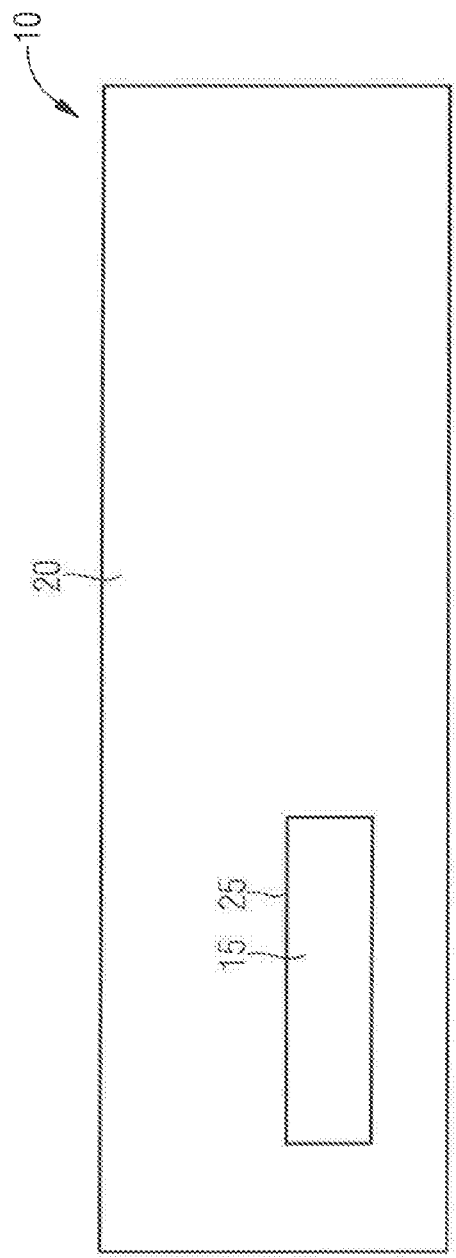
FIG. 1 shows a plan view of an arrangement in accordance with a first embodiment.
Figure 2:
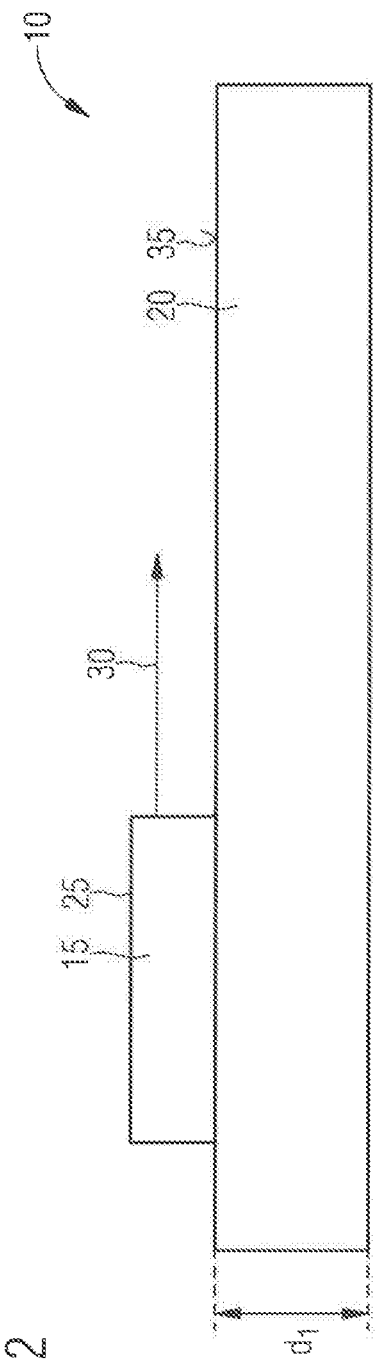
FIG. 2 shows a side view of the arrangement shown in FIG. 1.

FIG. 1 shows a plan view of an arrangement 10 in accordance with a first embodiment. FIG. 2 shows a side view of the arrangement 10 shown in FIG. 1. The arrangement 10 comprises a semiconductor component 15 and a heat sink 20. The semiconductor component 15 is configured by way of example as an optoelectronic semiconductor component 15. The semiconductor component 15 is arranged on the heat sink 20.

The optoelectronic semiconductor component 15 comprises at least one laser chip 25. The laser chip 25 is configured to provide electromagnetic radiation in the form of a light beam 30, which is configured as a laser beam in the embodiment, comprising a beam direction. In this case, the laser chip 25 is configured as an edge emitter, such that the light beam 30 emitted by the laser chip 25, in the embodiment, by way of example, passes largely parallel to a top side 35 of the heat sink 20 and is emitted laterally from the optoelectronic semiconductor component 15. It goes without saying that it is also conceivable for the light beam 30 to be emitted obliquely or perpendicularly with respect to the top side 35 of the heat sink 20. Alternatively, it is also conceivable for the optoelectronic semiconductor component 15 to comprise an LED chip, wherein the LED chip provides the light beam 30 comprising the beam direction.

Upon activation of the optoelectronic semiconductor component 15, the optoelectronic semiconductor component 15 heats up. The optoelectronic semiconductor component 15 is thermally coupled to the heat sink 20 by virtue of the arrangement on the heat sink 20. In this case, the heat sink 20 dissipates heat from the optoelectronic semiconductor component 15 and ensures that the optoelectronic semiconductor component 15 is operated below a maximum operating temperature upon activation, such that an overheating of the optoelectronic semiconductor component 15 is avoided.

The heat sink 20 comprises a material which is both electrically and thermally conductive. In this case, the material comprises at least aluminum and silicon. These together form an alloy composite. It is particularly advantageous here if the material of the heat sink 20 comprises a proportion by mass of aluminum which is less than 40 percent, in particular less than 25 percent, and at least greater than 5 percent, preferably greater than 10 percent, in particular greater than 15 percent. The material of the heat sink 20 furthermore advantageously comprises a proportion by mass of silicon which is greater than 60 percent, in particular greater than 75 percent, and at least less than 95 percent, preferably less than 90 percent, in particular less than 85 percent.

As a result of this material composition, the heat sink 20 comprises a thermal conductivity λ which comprises in a temperature range of 20° C. to 130° C. a value which is in a range of 180 W/mK to 350 W/mK, in particular of 190 W/mK to 300 W/mK.

A particularly compact design of the arrangement 10 and at the same time a good cooling of the optoelectronic semiconductor component 15 are ensured by virtue of the fact that the heat sink 20 comprises a thickness $d_1$ in a direction transversely with respect to the top side 35 comprising a value which is in a range of 50 to 300 μm, in particular in a range of 80 to 120 μm. It is particularly advantageous if the thickness $d_1$ of the heat sink 20 is 100 μm.

Figure 3:
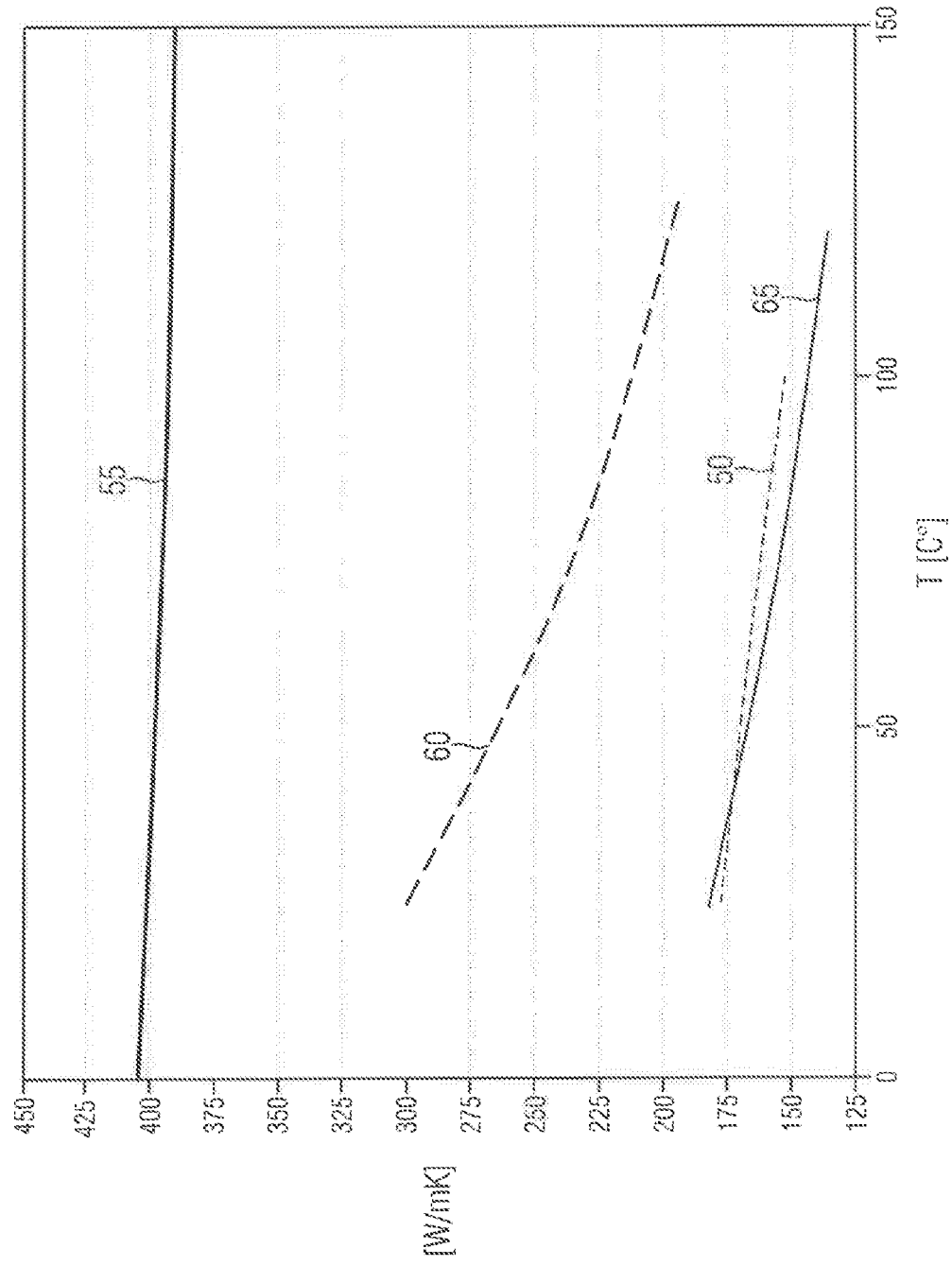
FIG. 3 shows a diagram of a thermal conductivity of a heat sink of the arrangement shown in FIGS. 1 and 2.

FIG. 3 shows a diagram of a thermal conductivity λ in W/(m·k) plotted against a temperature T in degrees Celsius. A plurality of graphs 50, 55, 60, 65 are depicted in the diagram. In this case, a first graph 50 shows a thermal conductivity λ of the heat sink 20 explained in FIGS. 1 and 2. A second graph 55 shows the thermal conductivity λ of copper (Cu). A third graph 60 shows the thermal conductivity λ of silicon carbide (SiC) and a fourth graph 65 shows the thermal conductivity of aluminum nitrite (AlN). All the graphs 50, 55, 60, 65 are plotted against temperature T in a temperature range of approximately 20° C. to 130° C. The material of the heat sink 20 (first graph 50) comprises in sections a higher thermal conductivity λ compared with aluminium nitrite (see, e.g., fourth graph 65). Proceeding from an arrangement 10 configured structurally identically, by means of the heat sink 20 shown in FIGS. 1 and 2, it is thereby possible for more heat to be dissipated from the optoelectronic semiconductor component 15 compared with the situation if the heat sink 20 comprises aluminum nitrite as material. This has the consequence that the optoelectronic semiconductor component 15 comprises a reduced operating temperature. Furthermore, an operating life of the optoelectronic semiconductor component 15 is increased by virtue of the reduced operating temperature. Furthermore, the material (AlSi) of the heat sink 20 is more cost-effective than aluminium nitride (see, e.g., fourth graph).

Although the thermal conductivity λ of the material of the heat sink 20 is lower than that of copper (see, e.g., second graph 55) and that of silicon carbide (see, e.g., third graph 60), the material of the heat sink 20 (aluminum, silicon) is more cost-effective than copper and silicon carbide, and so the arrangement 10 is particularly cost-effective in terms of production.

Figure 4:
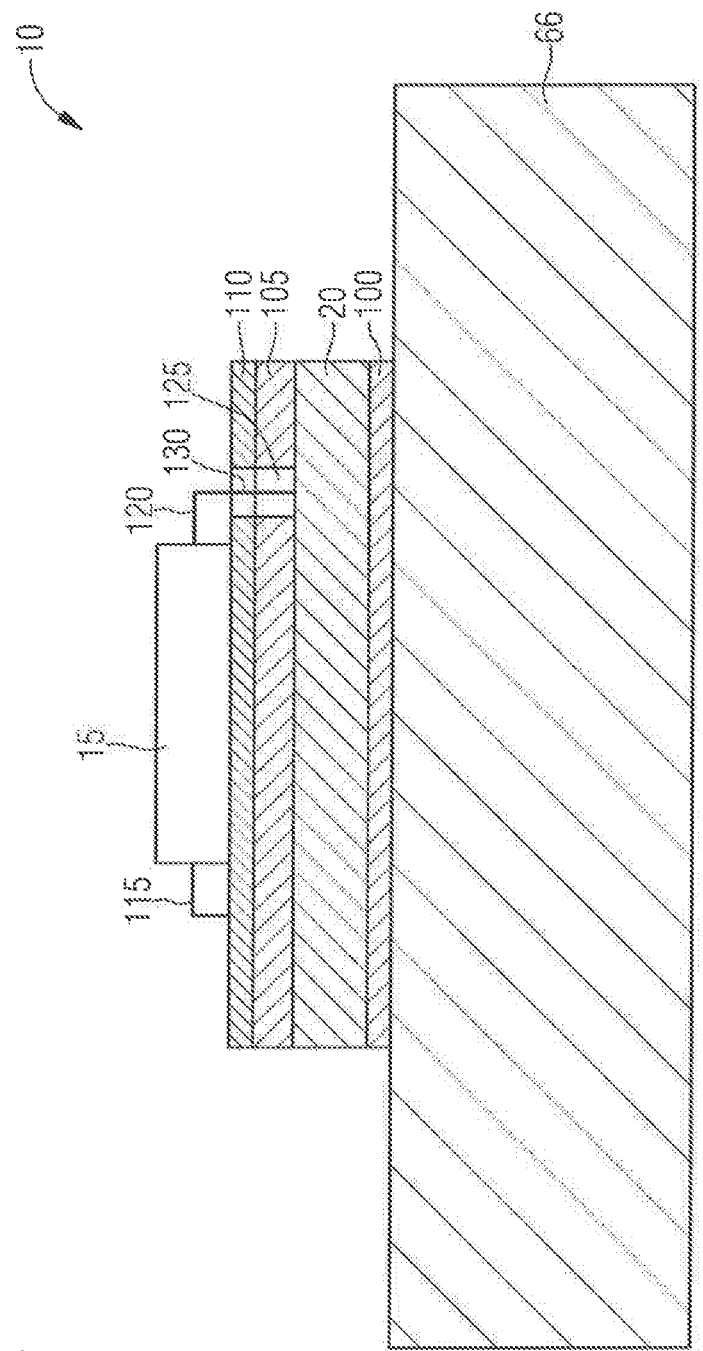
FIG. 4 shows a side view of an arrangement in accordance with a second embodiment.

FIG. 4 shows a side view of an arrangement 10 in accordance with a second embodiment. The arrangement 10 is configured similarly to the arrangement 10 shown in FIGS. 1 and 2. In a departure therefrom, the arrangement 10 additionally comprises a carrier 66 configured to be electrically conductive. The heat sink 20 is cohesively secured on the carrier 66 by means of a first connection layer 100. In this case, the first connection layer 100 is arranged on the underside of the heat sink 20 between the heat sink 20 and the carrier 66. The first connection layer 100 may comprise, for example, an electrically conductive solder.

In a departure therefrom, an electrical insulation layer 105 is provided on the top side on the heat sink 20, that is to say between the optoelectronic semiconductor component 15 and the heat sink 20. A second connection layer 110 is arranged on the top side on the electrical insulation layer 105, and mechanically, electrically and thermally connects the optoelectronic semiconductor component 15 to the electrical insulation layer 105 in a cohesive manner. The electrical insulation layer 105 is cohesively connected to the heat sink 20. In this case, the electrical insulation layer 105 is configured to electrically insulate the heat sink 20 from the optoelectronic semiconductor component 15. The first and/or second connection layer 100, 110 may comprise electrically conductive solder and/or an adhesive.

It is pointed out that, alternatively, the connection layer 100, 110 may be configured in a different way and may comprise, for example, an adhesive for cohesively connecting the heat sink 20 to the carrier 66 and/or the optoelectronic semiconductor component 15 to the heat sink 20. It is also conceivable for the electrical insulation layer 105 to cohesively connect the optoelectronic semiconductor component 15 to the heat sink 20.

The optoelectronic semiconductor component 15 comprises a first contact 115 and a second contact 120. The first contact 115 of the optoelectronic semiconductor component 15 is configured as an anode. The second contact 120 is configured as a cathode. The first contact 115 is connected to the second connection layer 110. As a result of the electrical insulation of the second connection layer 110 from the heat sink 20, the first electrical contact 115 is also electrically insulated from the heat sink 20 by the electrical insulation layer 105.

The second connection layer 110 and the electrical insulation layer 105 comprise a recess 125. A first electrical connection 130 is arranged in the recess 125. The first electrical connection 130 is connected to the heat sink 20 and to the second contact 120 of the optoelectronic semiconductor component 15. The first electrical connection 130 electrically connects the heat sink 20 to the second contact 120. In this case, the first electrical connection 130 may be configured, for example, as a bond wire or as a terminal pin of the optoelectronic semiconductor component 15.

The carrier 66 may for its part by electrically connected to further components (not illustrated), i.e., to a control unit.

Figure 5:
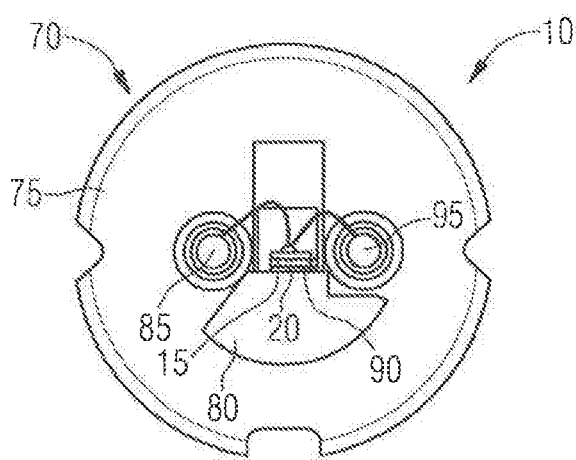
FIGS. 5 and 6 show side views of a structural configuration of the arrangement shown in FIG. 4.
Figure 6:
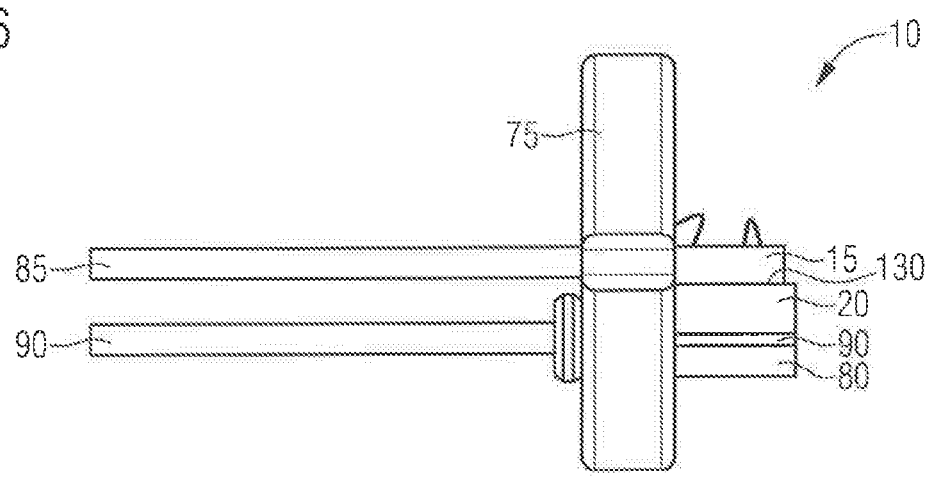
Figure 7:
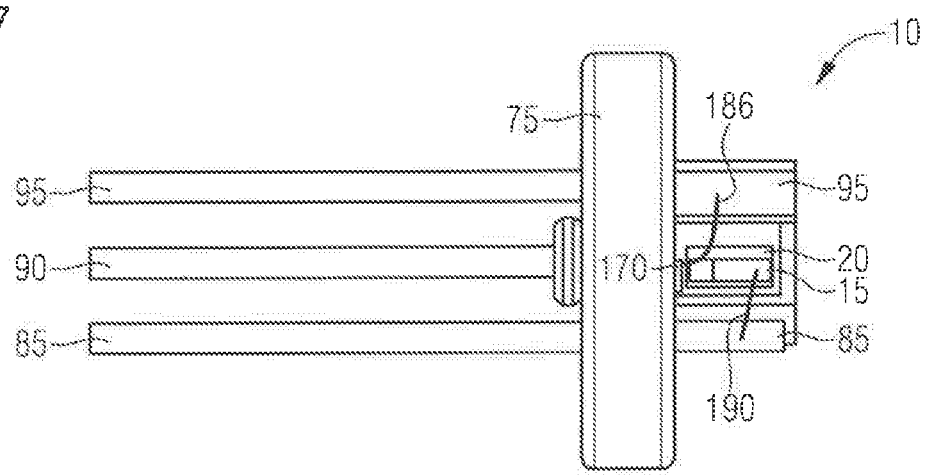
FIG. 7 shows a plan view of the arrangement shown in FIGS. 5 and 6.
Figure 8:
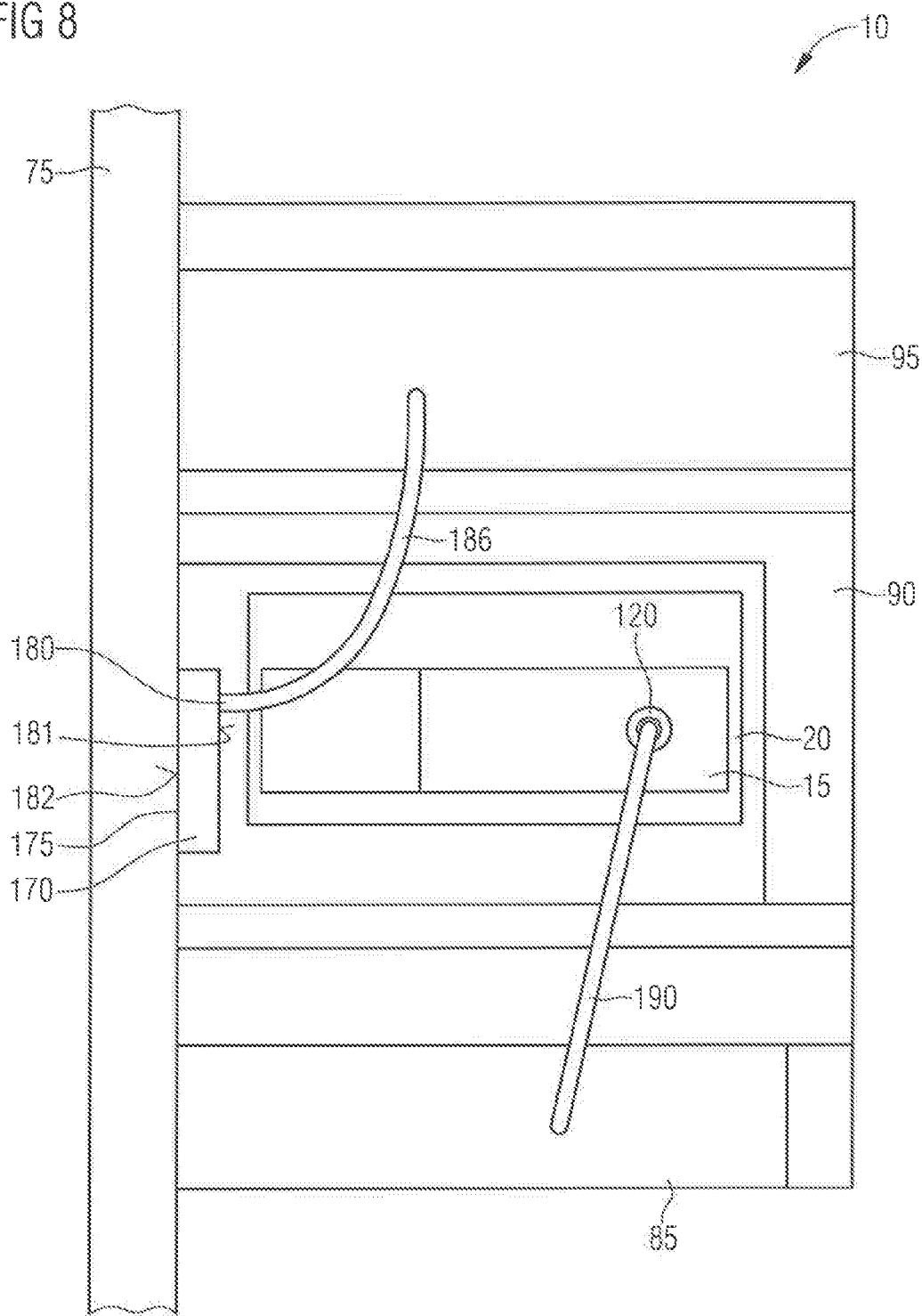
FIG. 8 shows an excerpt from the arrangement shown in FIG. 7.

FIGS. 5 and 6 show side views of a structural configuration of the arrangement 10 shown in FIG. 4. FIG. 7 shows a plan view of the arrangement 10 shown in FIGS. 4 and 5, and FIG. 8 shows an excerpt from the arrangement 10 shown in FIG. 6. FIGS. 5 to 8 are explained jointly.

The arrangement 10 comprises a housing 70 comprising a housing wall 75, which is configured in a circular fashion by way of example, and a housing web 80. In this case, the housing wall 75 is configured in a planar fashion by way of example. It goes without saying that it is also conceivable for the housing wall 75 to comprise other cross sections or to be configured in a curved fashion. The housing web 80 is connected to the housing wall 75 and is arranged substantially perpendicularly to the housing wall 75. In this case, the housing web 80 extends substantially perpendicularly away from the housing wall 75. The housing wall 75 is configured to be electrically conductive.

The arrangement 10 comprises a first contact conductor 85, a second contact conductor 90 and a third contact conductor 95. The contact conductors 85, 90, 95 are electrically conductive. The contact conductors 85, 90, 95 are led through the housing wall 75 and project beyond the housing wall 75 on both sides. Furthermore, the contact conductors 85, 90, 95 are arranged at a distance from one another, wherein the contact conductors 85, 90, 95 are firstly mechanically secured by the housing wall 75. The contact conductors 85, 90, 95 are electrically insulated from one another. The contact conductors 85, 90, 95 can be connected to a control unit for the operation of the arrangement 10.

In this case, the heat sink 20 is arranged between the first contact conductor 85 and the third contact conductor 95 on the top side of the second contact conductor 90. In this case, the heat sink 20 may be mechanically connected to the second contact conductor 90. The second contact conductor 90 is arranged on the housing web 80. Furthermore, the second contact conductor 90 is electrically connected to the housing wall 75. The housing wall 75 may for its part be electrically connected to a ground.

The first contact 115 of the optoelectronic semiconductor component 15 is arranged by way of example on the underside on the optoelectronic semiconductor component 15. The first contact 115 is electrically connected to the heat sink 20 by means of the first electrical connection 130. The heat sink 20 is for its part electrically connected to the second contact conductor 90.

The arrangement 10 furthermore comprises a photodiode 170. The photodiode 170 is arranged on the housing wall 75. In this case, an underside 182 of the photodiode 170 is mechanically connected to the housing wall 75. In this case, the photodiode 170 is arranged in such a way that the photodiode 170 may detect at least part of the light beam emitted by the optoelectronic semiconductor component 15 during activated operation (not illustrated). The photodiode 170 comprises a first photodiode contact 175 and a second photodiode contact 180. In this case, the first photodiode contact 175 is configured as a cathode. In this case, the second photodiode contact 180 is configured as an anode.

The first photodiode contact 175 is arranged on an underside 182 of the photodiode 170. The second photodiode contact 180 is arranged by way of example on a top side 181 of the photodiode 170. The top side 181 of the photodiode 170 is arranged on an opposite side relative to the underside 182. The first photodiode contact 175 is electrically connected to the housing wall 75. The second photodiode contact 180 is electrically connected to the third contact conductor 95 by means of a second electrical connection 186. The second electrical connection 186 is configured as a bond wire, for example.

The first contact conductor 85 is electrically connected to the second contact 120 of the optoelectronic semiconductor component 15 by means of a third electrical connection 190, which is configured as a bond wire by way of example in the embodiment.

Figure 9:
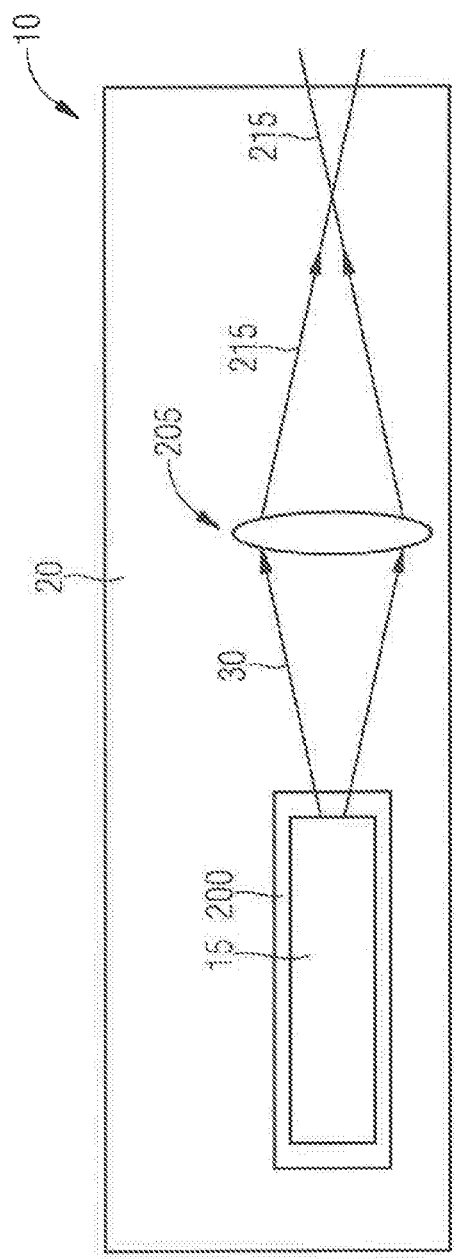
FIG. 9 shows a plan view of an arrangement in accordance with a third embodiment.

FIG. 9 shows a plan view of an arrangement 10 in accordance with a third embodiment. Figure to shows a side view of the arrangement 10 shown in FIG. 9. The arrangement 10 is configured similarly to the configuration of the arrangement 10 as shown in FIGS. 1, 2 and 4. In a departure therefrom, the arrangement 10 additionally comprises a heat spreader 200. The heat spreader 200 comprises a larger extent than the optoelectronic semiconductor component 15 at least in one direction of extent of the optoelectronic semiconductor component 15. In the embodiment, by way of example, in a direction of extent parallel to the top side 35, the heat spreader 200 is configured such that it is wider than the optoelectronic semiconductor component 15. The heat spreader 200 is arranged between the optoelectronic semiconductor component 15 and the heat sink 20. In this case, the heat spreader 200 is configured to be thermally conductive and passes on the heat from the optoelectronic semiconductor component 15 to the heat sink 20. In addition, it is also conceivable for the heat spreader to be configured to be electrically conductive. As a result of the wider configuration, a good heat distribution to the heat sink 20 is ensured by the heat spreader 200. The heat spreader 200 in this case advantageously comprises at least one of the following materials: silicon carbide (SiC), aluminum nitrite (AlN), copper (Cu), diamond, copper-tungsten (CuW), boron nitrite (BN).

Furthermore, the arrangement 10 comprises an optical device 205. The optical device 205 is arranged on the heat sink 20 and is mechanically connected to the heat sink 20. In this case, the optical device 205 comprises a lens which is configured as a focusing element 210 and which at least partly catches the light beam 30 and focuses it as a directional light beam 215 onto a predefined region. Alternatively, it is also conceivable for the focusing element 210 to alter the light beam 30 to the effect that the latter is collimated. Alternatively, it is also conceivable for the optical device 205 to expand the light beam 30, for example. It is also conceivable for the optical device 205 to be configured in a different way and/or to comprise a plurality of focusing elements.

FIG. 11 shows a schematic illustration of a plan view of an arrangement 10 in accordance with a fourth embodiment. FIG. 12 shows a side view of the arrangement 10 shown in FIG. 11. The arrangement 10 is configured similarly to the arrangement 10 shown in FIGS. 1 and 2. In a departure therefrom, the arrangement 10 comprises, besides the optoelectronic semiconductor component 15, at least one further optoelectronic semiconductor component 300. Two further optoelectronic semiconductor components 300 are illustrated by way of example in FIG. 11. It goes without saying that a different number of further optoelectronic semiconductor components 300 may also be provided.

The further optoelectronic semiconductor component 300 comprises a further laser chip 305. The further laser chip 305 is configured, upon activation, to provide electromagnetic radiation in the form of a further laser beam configured as a light beam 310. In the embodiment, the optoelectronic semiconductor component 15 and the further optoelectronic semiconductor component 300 are arranged in a manner laterally offset with respect to the beam direction of the light beam 30 of the optoelectronic semiconductor component 15. In this case, the light beam 30 of the optoelectronic semiconductor component 15 and the further light beam 310 of the further optoelectronic semiconductor component 300 substantially run parallel to one another.

The further optoelectronic semiconductor component 300 and the optoelectronic semiconductor component 15 are arranged jointly on the heat sink 20, such that the arrangement 10 may be configured particularly cost-effectively. The heat sink 20 dissipates the heat that arises during the operation of the optoelectronic semiconductor components 15, 300 from the optoelectronic semiconductor components 15, 300, such that the latter are reliably cooled and an overheating is avoided by means of the heat sink 20 of the optoelectronic semiconductor components 15, 300.

Furthermore, it is additionally conceivable for the electrical contacting, as explained in FIG. 4, also to be applied to the arrangement 10 shown in FIGS. 11 and 12, such that the further optoelectronic semiconductor component 300 is also electrically connected to the heat sink 20.

As an alternative to the above-described configuration of the further optoelectronic semiconductor component 300, it is also conceivable for the further optoelectronic semiconductor component 300 to comprise a further LED chip, wherein the further LED chip is configured to provide the further light beam 310.

FIG. 13 shows a plan view of an arrangement 10 in accordance with a fifth embodiment and FIG. 14 shows a side view of the arrangement 10 shown in FIG. 13. The arrangement 10 is configured similarly to the arrangement 10 shown in FIGS. 11 and 12. In a departure therefrom, the optoelectronic semiconductor component 15 is configured as a laser diode array and comprises a plurality of laser diodes 400, 405, 410, which each provide a laser beam configured as a light beam 415, 420, 425. In this case, the light beams 415, 420, 425 run substantially parallel and, for example, parallel to the top side 35 of the heat sink 20. By virtue of a plurality of laser diodes 400, 405, 410 being provided, the optoelectronic semiconductor component 15 comprises an increased evolution of heat, which is reliably dissipated from the optoelectronic semiconductor component 15 by the heat sink 20 as a result of the improved conductivity vis-à-vis aluminum nitride, such that an overheating of the laser diodes 400, 405, 410 upon activation is reliably avoided.

FIG. 15 shows a schematic illustration of a plan view of an arrangement 10 in accordance with a sixth embodiment. FIG. 16 shows a side view of the arrangement 10 shown in FIG. 15. The arrangement 10 is configured similarly to the arrangement 10 shown in FIGS. 9 and 10. In a departure therefrom, the heat spreader 200 is dispensed with, such that the optoelectronic semiconductor component 15 is secured directly on the heat sink 20. This configuration is particularly cost-effective.

Figure 17:
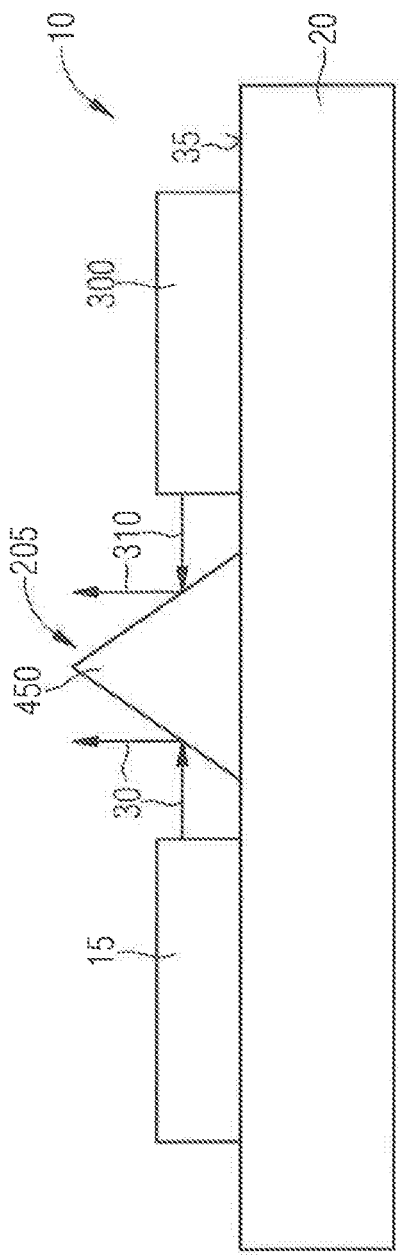
FIG. 17 shows a schematic illustration of a side view of an arrangement in accordance with a seventh embodiment.

FIG. 17 shows a schematic illustration of a side view of an arrangement 10 in accordance with a seventh embodiment. The arrangement 10 is a combination of the arrangements to explained in FIGS. 11, 12, 15 and 16. The arrangement 10 comprises the optoelectronic semiconductor component 15 and the further optoelectronic semiconductor component 300. In this case, the optoelectronic semiconductor component 15 and the further optoelectronic semiconductor component 300 are arranged generally on the heat sink 20. The further optoelectronic semiconductor component 300 is arranged opposite the optoelectronic semiconductor component 15 in the beam direction of the light beam 30 of the optoelectronic semiconductor component 15. Between the two optoelectronic semiconductor components 15, 300, the optical device 205 is arranged on the heat sink 20, said optical device comprising a prism 450 in the embodiment. The optical device 205 can additionally also comprise the focusing element 210, explained in FIGS. 9 and 10, e.g., above the prism 460 and/or between the optoelectronic semiconductor component 15, 200 and the prism 450.

Upon activation of the optoelectronic semiconductor component 15 and of the further optoelectronic semiconductor component 300, the optoelectronic semiconductor components 15, 300 emit the light beam 30, 310, wherein the optoelectronic semiconductor components 15, 300 in each case radiate in the direction of the other optoelectronic semiconductor component 15, 300 arranged opposite. The prism 450 deflects the light beam 30, 310, which runs substantially parallel to the top side 35, by 90°, for example, such that the light beam 30, 310 can be emitted away from the arrangement 10.

Figure 18:
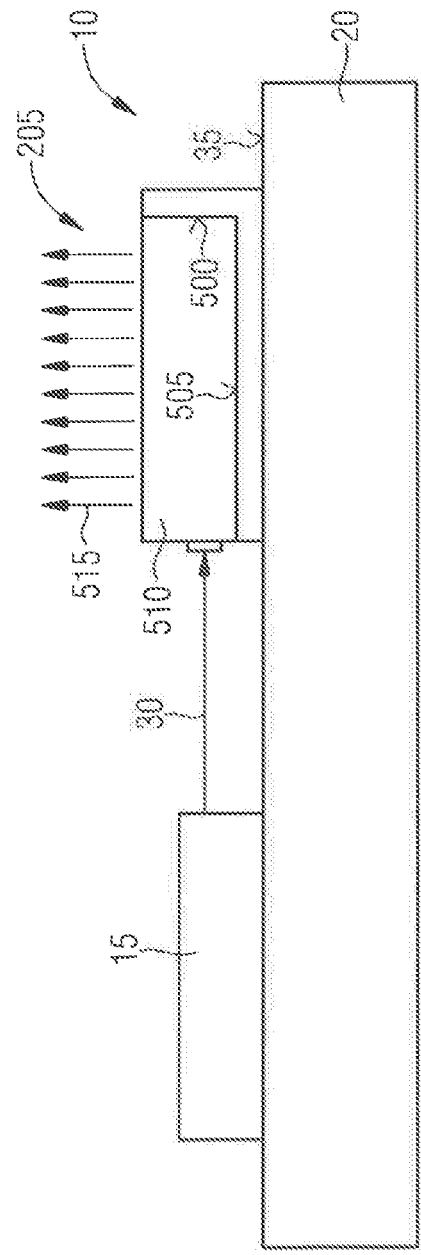
FIG. 18 shows a plan view of an arrangement in accordance with an eighth embodiment.

FIG. 18 shows a side view of an arrangement 10 in accordance with a seventh embodiment. The arrangement 10 is configured similarly to the configuration of the arrangement 10 as explained in FIGS. 15 and 16. In a departure therefrom, the optical device 205 comprises a plurality of mirror elements 500, 505 and at least one converter element 510.

In this case, a first mirror element 500 is arranged in a manner laterally adjoining the converter element 510. A second mirror element 505 is arranged on the underside of the converter element 510 and thus between the converter element 510 and the heat sink 20.

The converter element 510 comprises, for example, a ceramic layer and/or a matrix comprising scattering particles or a conversion matrix. Alternatively, it is also conceivable for the converter element 510 additionally or alternatively to comprise a ceramic layer and/or a matrix comprising scattering particles. The optical device 205 is arranged in the light beam 30 of the optoelectronic semiconductor component 15. In this case, the light beam 30 radiates laterally into the optical device 205.

The light beam 30 is taken up laterally into the converter element 510 as primary radiation. In the embodiment, for example, the converter element 510 converts at least one first portion of the primary radiation of the light beam 30 into a secondary radiation, the wavelength of which is longer than the wavelength of the light beam 30. In this case, the converter element 510 heats up. In this case, the converter element 510 emits the secondary radiation in all directions. The secondary radiation and a non-converted second portion of the primary radiation are reflected by the mirror elements 500, 505, such that a light 515 emitted from the optical device 205 is emitted substantially perpendicularly to the top side 35 of the heat sink 20.

The arrangement 10 of the optoelectronic semiconductor component 15 and of the optical device 205 on the heat sink 20 ensures that the optical device 205, in particular the converter element 510, is also reliably cooled by the heat sink 20 and an overheating of the optical device 205 is thus also avoided. A reliable aging of the converter element 510 is reduced as a result.

Figure 10:
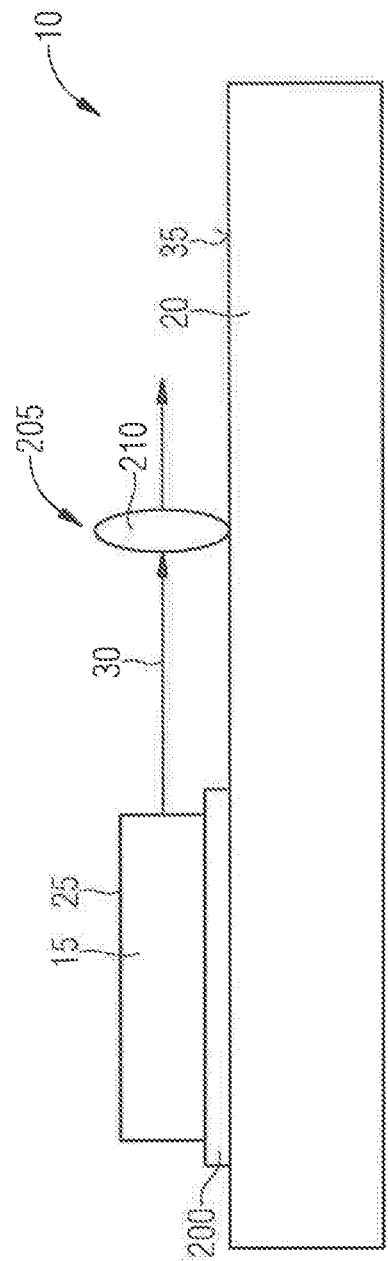
FIG. 10 shows a side view of the arrangement shown in FIG. 9.
Figure 19:
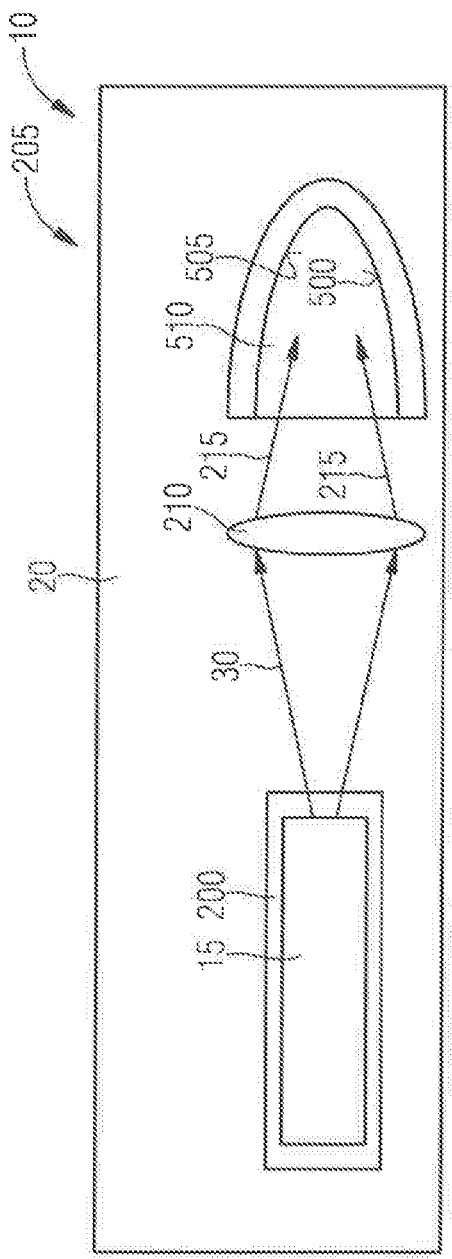
FIG. 19 shows a schematic illustration of a plan view of an arrangement in accordance with a ninth embodiment.
Figure 20:
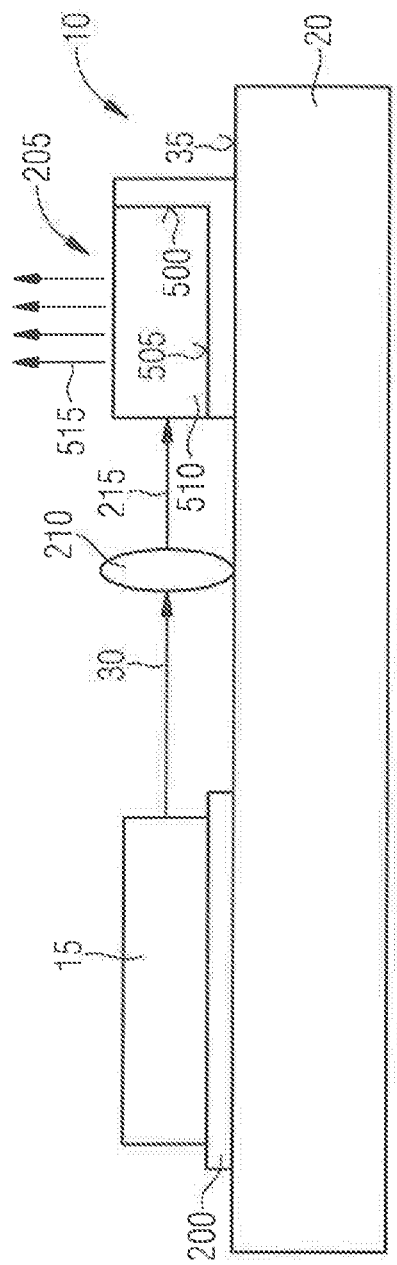
FIG. 20 shows a side view of the arrangement shown in FIG. 19.

FIG. 19 shows a schematic illustration of a plan view of an arrangement 10 in accordance with a ninth embodiment and FIG. 20 shows a side view of the arrangement 10 shown in FIG. 19. The arrangement 10 is substantially a combination of the different embodiments of the arrangements to as shown in FIGS. 9, 10 and 18. In this case, the optical device 205 comprises the focusing element 210 shown in FIGS. 9 and 10 and the converter element 510 shown in FIG. 18 and the mirror elements 500, 505. The focusing element 210 is arranged between the converter element 510 and the optoelectronic semiconductor component 15 on the heat sink 20. Furthermore, the heat spreader 200 explained in FIGS. 9 and 10 is provided between the optoelectronic semiconductor component 15 and the heat sink 20.

The optoelectronic semiconductor component 15 emits the light beam 30. The focusing element 210 focuses the light beam 30 to form the directional light beam 215, which enters the converter element 510. The converter element 510 uses the directional light beam 215 as primary radiation and converts at least the first portion of the primary radiation, as already explained in FIG. 18, into secondary radiation, which either is emitted upward directly by the converter element 510 or is reflected upward via the mirror elements 500, 505. The non-converted second portion of the directional light beam 215 is reflected upward via the mirror elements 500, 505.

As a result of the arrangement 10 of the focusing element 210 and of the converter element 510 and also of the mirror elements 500, 505 on the heat sink 20, besides the heat that arises during the operation of the optoelectronic semiconductor component 15, heat from the optical device 205 may also be dissipated well and an overheating of the optical device 205 may be avoided.

Although the invention has been more specifically illustrated and described in detail by means of the preferred exemplary embodiment, nevertheless the invention is not restricted by the examples disclosed and other variations may be derived therefrom by a person skilled in the art, without departing from the scope of protection of the invention. In particular, it is pointed out that the various embodiments described in FIGS. 1 to 20 may also be combined with one another in different ways.

The invention claimed is:

1. An arrangement comprising:
at least one semiconductor component;
a heat sink,
wherein the semiconductor component is arranged on the heat sink,
wherein the heat sink is configured to dissipate heat from the semiconductor component,
wherein the heat sink comprises a thermally conductive material, and
wherein the material comprises at least aluminum and silicon; and
a first contact conductor, at least one second contact conductor and a housing comprising a housing wall,
wherein the first contact conductor and the second contact conductor are arranged at a distance from one another,
wherein the first contact conductor and the second contact conductor are led through the housing wall and are electrically insulated from one another by the housing wall,
wherein the heat sink is arranged at least partly between the first contact conductor and the second contact conductor, and
wherein the heat sink is electrically connected to the first contact conductor.

2. The arrangement according to claim 1, further comprising a photodiode comprising a first photodiode contact, a second photodiode contact and a third contact conductor, which is led through the housing wall, wherein the first photodiode contact is electrically connected to a first contact of the semiconductor component and the second photodiode contact is electrically connected to the third contact conductor.

3. An arrangement comprising:
   at least one semiconductor component;
   a heat sink,
   wherein the semiconductor component is arranged on the heat sink,
   wherein the heat sink is configured to dissipate heat from the semiconductor component,
   wherein the heat sink comprises a thermally conductive material, and
   wherein the material comprises at least aluminum and silicon;
   a heat spreader,
   wherein the heat spreader comprises a larger extent than the semiconductor component at least in one direction of extent of the semiconductor component,
   wherein the heat spreader is arranged between the semiconductor component and the heat sink and is configured to pass on the heat from the semiconductor component to the heat sink, and
   wherein the heat spreader comprises silicon carbite (SiC), aluminum nitrite (AlN), copper (Cu), diamond, boron nitrite (BN) or copper-tungsten (CuW); and
   an optical device arranged on the heat sink and mechanically and thermally coupled to the heat sink, wherein the optical device is configured to alter at least partly a beam direction of a light beam.

4. The arrangement according to claim 3, further comprising at least one further optoelectronic semiconductor component, wherein the further optoelectronic semiconductor component comprises at least one further laser chip or a further LED chip, wherein the further laser chip or the further LED chip is configured to emit further electromagnetic radiation, and wherein the semiconductor component and the further optoelectronic semiconductor component are arranged jointly on the heat sink.

5. The arrangement according to claim 4,
   wherein the further optoelectronic semiconductor component is arranged in a manner laterally offset with respect to the beam direction of the optoelectronic semiconductor component, and/or wherein the further optoelectronic semiconductor component is arranged opposite the semiconductor component in the beam direction of the semiconductor component.

6. The arrangement according claim 1,
   wherein the first and second contact conductors are led through the housing wall and project beyond the housing wall on both sides, and
   wherein the first and second contact conductors are firstly mechanically secured by the housing wall and are electrically insulated from one another.

7. The arrangement according to claim 1, wherein the heat sink is electrically and thermally conductive.

8. The arrangement according to claim 1, wherein the material comprises a proportion by mass of aluminum which is less than 40 percent and at least greater than 40 percent.

9. The arrangement according to claim 8, wherein the material comprises a proportion by mass of silicon which is greater than 60 percent and at least less than 95 percent.

10. The arrangement according to claim 1, wherein the heat sink comprises a thickness comprising a value, and wherein the value of the thickness is in a range of 50 µm to 300 µm.

11. The arrangement according to claim 1, wherein a thermal conductivity of the heat sink in a temperature range of 20° C. to 130° C. comprises a value which is in a range of 180 W/mK to 350 W/mK.

12. The arrangement according to claim 1,
   wherein an electrical insulation layer is arranged between the semiconductor component and the heat sink,
   wherein the electrical insulation layer comprises at least one recess, and
   wherein an electrical connection is arranged in the recess electrically connecting a second contact to the heat sink.

13. The arrangement according to claim 12,
   wherein a connection layer is arranged between the electrical insulation layer and the semiconductor component,
   wherein the connection layer mechanically connects the semiconductor component to the electrical insulation layer, and
   wherein a first contact is connected to the connection layer.

* * * * *